United States Patent [19]
Shirai

[11] Patent Number: 5,122,855
[45] Date of Patent: Jun. 16, 1992

[54] SEMICONDUCTOR DEVICE WITH LATCH-UP PREVENTION STRUCTURE

[75] Inventor: Koji Shirai, Kawasaki, Japan
[73] Assignee: Kabushiki Kaisha Toshiba, Kawasaki, Japan
[21] Appl. No.: 301,674
[22] Filed: Jan. 26, 1989
[30] Foreign Application Priority Data Jan. 29, 1988 [JP] Japan .................................. 63-17361

[51] Int. Cl.[5] ......................................... H01L 27/02
[52] U.S. Cl. .................................... 357/42; 357/23.13; 357/13
[58] Field of Search ......................... 357/42, 23.13, 13

[56] References Cited

U.S. PATENT DOCUMENTS

| | | | |
|---|---|---|---|
| 3,667,009 | 5/1972 | Rugg | 357/23.13 |
| 4,327,368 | 4/1982 | Uchida | 357/42 |
| 4,476,476 | 10/1984 | Yu et al. | 357/23.13 |
| 4,593,458 | 6/1986 | Adler | 357/42 |
| 4,616,243 | 10/1986 | Minato et al. | 357/42 |
| 4,626,882 | 12/1986 | Cottrell et al. | 357/42 |

FOREIGN PATENT DOCUMENTS

| | | | |
|---|---|---|---|
| 0143648 | 7/1985 | Japan | 357/42 |
| 0252464 | 10/1988 | Japan | 357/42 |

Primary Examiner—Jerome Jackson, Jr.
Assistant Examiner—Dang Xuan Hung
Attorney, Agent, or Firm—Finnegan, Henderson, Farabow, Garrett, and Dunner

[57] ABSTRACT

A semiconductor device comprises first and second island regions of a first conductivity type formed closely to each other in the surface area of a semiconductor substrate, first-and second-channel type MOS FETs formed in the first island region, and a high impurity concentration region of the first conductivity type having an impurity concentration higher than the island regions and formed between the substrate and at least one of the first and second island regions, the high impurity concentration region being formed to surround the island regions.

8 Claims, 7 Drawing Sheets

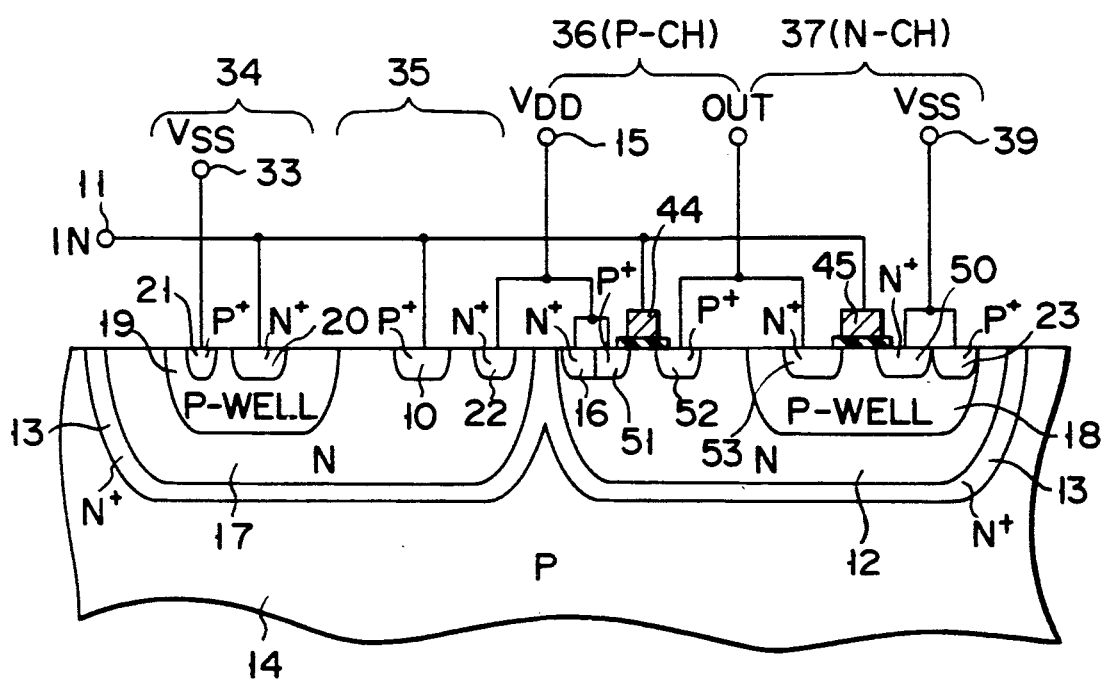
F I G. 1
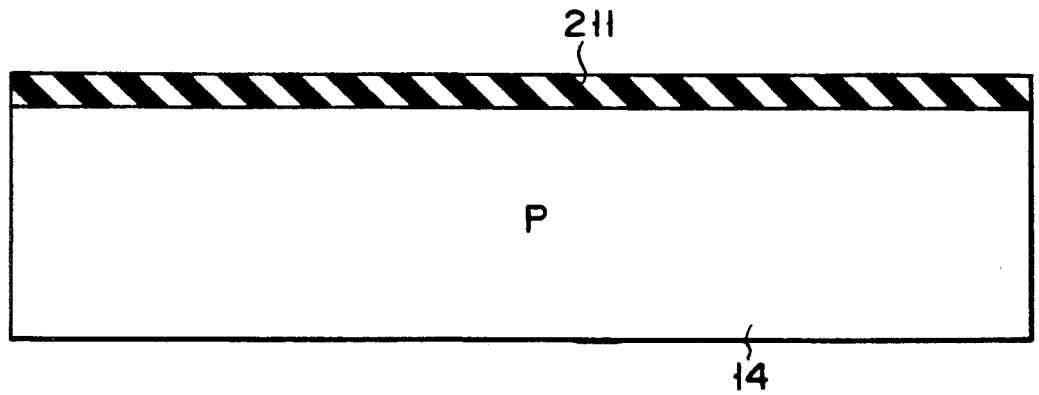
F I G. 2A

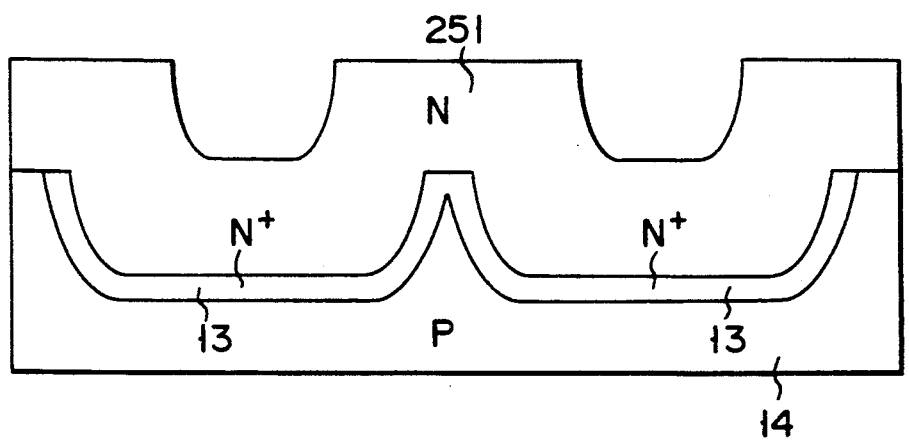
F I G. 2E
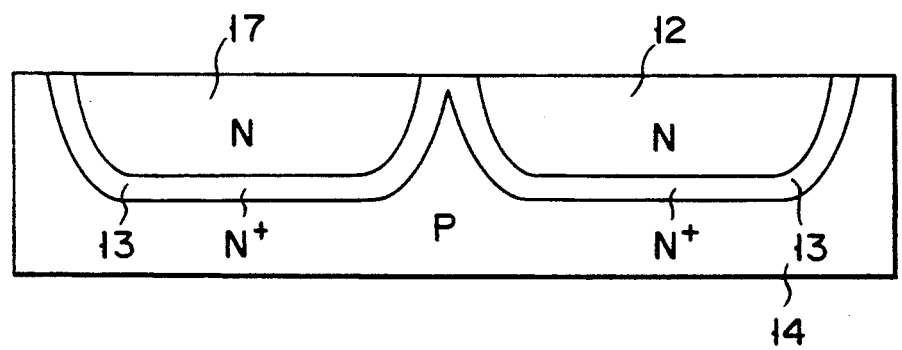
F I G. 2F
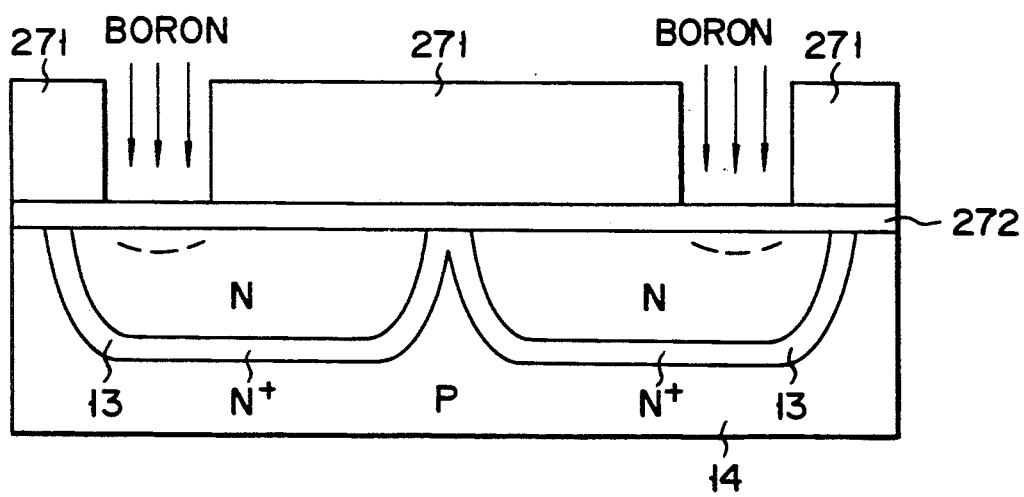
F I G. 2G

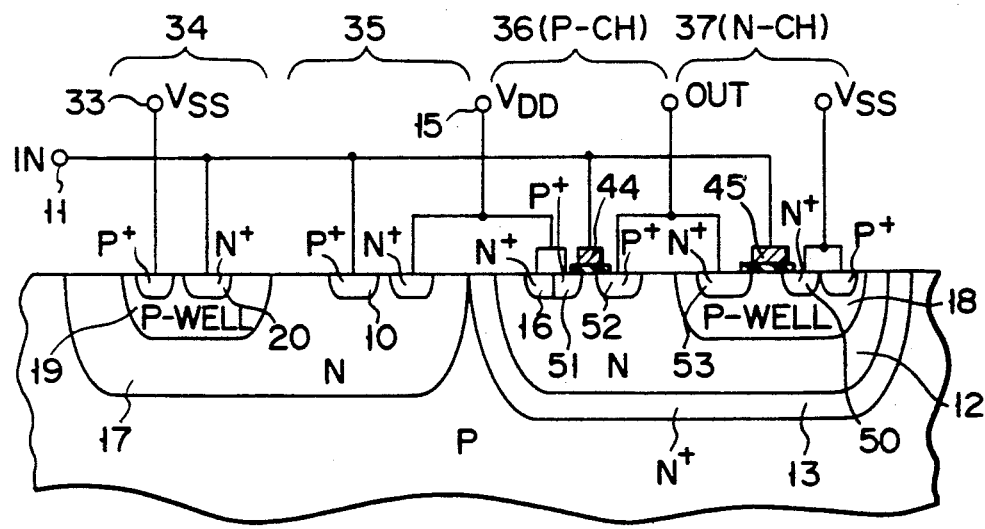
F I G. 7
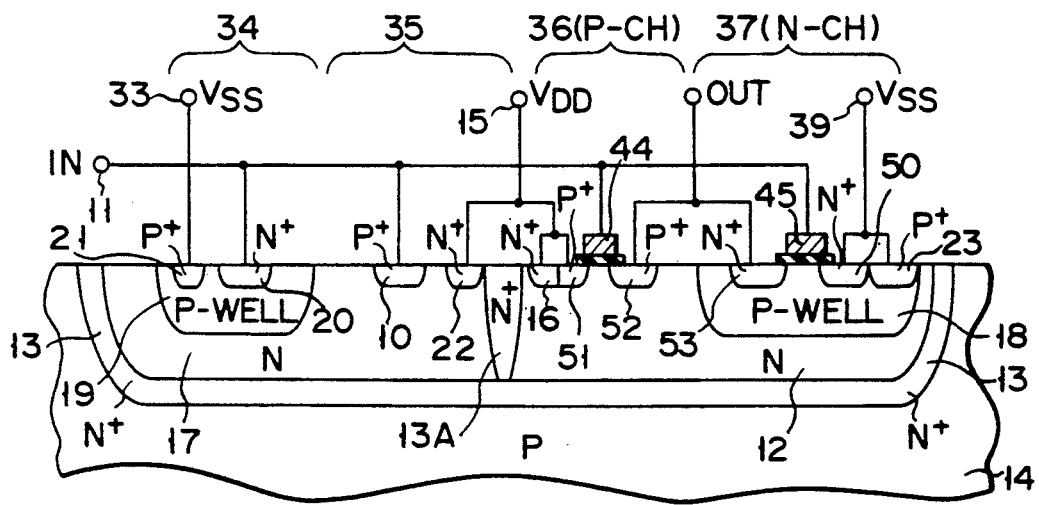
F I G. 8
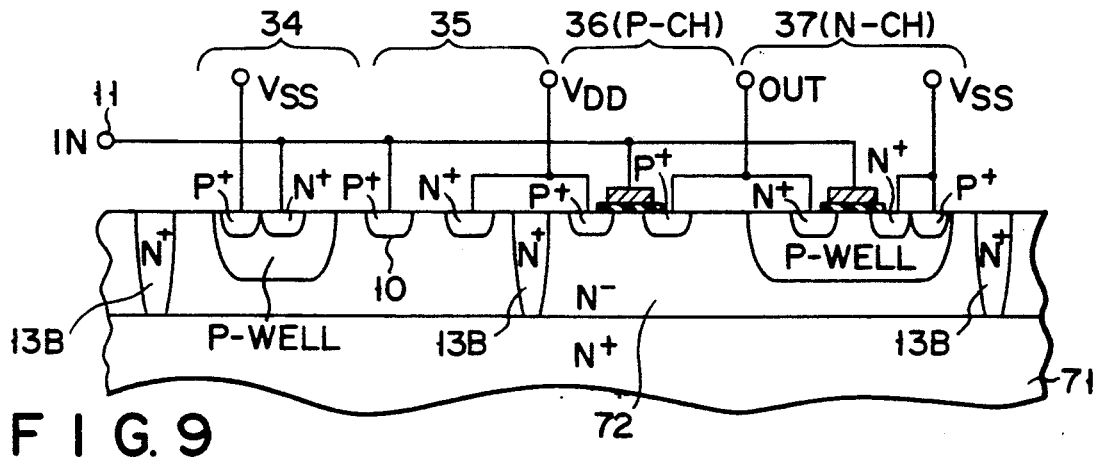
F I G. 9

SEMICONDUCTOR DEVICE WITH LATCH-UP PREVENTION STRUCTURE

BACKGROUND OF THE INVENTION

1. Field of the Invention

This invention relates to a semiconductor device, and more particularly to a CMOS integrated circuit having the structure for preventing the latch-up phenomenon.

2. Description of the Related Art

In a complementary MOS (CMOS) inverter circuit which is formed as a basic circuit element of CMOS integrated circuit, the drains of P-channel type MOS FET 36 and N-channel type MOS FET 37 are commonly connected to output terminal 38 as shown by block A in FIG. 6. The sources of P-channel type MOS FET 36 and N-channel type MOS FET 37 are respectively connected to power source terminal VDD 32 and GND terminal VSS 39. The gate of each MOS FET is connected to input terminal IN 11.

In order to prevent the gate of the CMOS FET from being damaged, gate protection diodes 35 and 34 are respectively connected between power source terminal VDD 32 and input terminal IN 11 and between input terminal IN 11 and GND terminal VSS 33 as shown by block B in FIG. 6.

FIG. 5 shows an example of the cross section of such CMOS integrated circuit device.

P-channel type MOS FET 36 includes P-type source 51, drain 52, and gate electrode 44 formed on a gate insulation film which is formed on that portion of the surface of substrate 14 which lies between the source and drain. N-channel type MOS FET 37 is formed in P-type well 43 which is formed in the surface area of substrate 14. N-channel type MOS FET 37 includes N-type source 50 and drain 53 formed in the surface area of well 43, and gate electrode 45 formed on a gate insulation film which is formed on that portion of the surface of well 43 which lies between the source and drain.

Protection diode 35 is formed to have substrate 14 acting as a cathode and P-type layer 46 formed in the surface area of substrate 14 to serve as an anode. Diode 34 is formed to have P-type well 47 formed in the surface area of substrate 14 to serve as an anode and N-type layer 48 formed in the surface area of well 47 to serve as a cathode.

For example, when a noise voltage higher than the voltage applied to power source terminal VDD 32 is introduced into input terminal IN 11 of the above MOS integrated circuit, current component I1 flows in the surface area of substrate 14 from P-type layer 46 acting as the anode of protection diode 35 to N-type layer 49 used as a substrate contact of P-channel type MOS FET 36. That is, protection diode 35 is forwardly biased and made conductive to lower the potential of the gate electrode of the CMOS FET to substantially VDD level, thus preventing the gate from being damaged. However, in this case, all the current does not flow into N-type contact layer 49, and current component I2 will flow in the bottom portion of substrate 14.

Current component I2 flows in the path of input terminal 11→P-type anode layer 46→N-type substrate 14→P-type well 43→N-type source 50→GND terminal 39. In the current path, a parasitic thyristor with four-layer PNPN structure is formed to have layer 46, substrate 14, well 43 and source 50. If current component I2 is negligible, the thyristor will not actually be turned on. However, if current component I2 becomes large, a so-called latch-up phenomenon occurs, making the parasitic thyristor operative. As a result, a conduction current flows continuously between power source terminal VDD and GND terminal VSS. Therefore, the normal operation of the MOS FET cannot be effected and the MOS FET may be damaged by heat which is generated by a large thyristor conduction current. Conventionally, in order to solve this problem, anode layer 46 of diode 35 is formed to be as far away as possible from well 43 of MOS FET 37 so as to suppress current component I2 to a minimum.

The same problem concerning the parasitic thyristor as described above occurs in the case of a combination of diode 34 and P-channel type MOS FET 36. Also in this case, it is necessary to set well 47 of diode 34 sufficiently far away from P-type source 51 of MOS FET 36. For example, in the conventional case, the distance between anode layer 46 of diode 35 and N-type contact layer 49 of P-channel type MOS FET 36 was set as large as 50 μm. As a result, the occupied area of the CMOS integrated circuit becomes large, lowering the integration density.

SUMMARY OF THE INVENTION

An object of this invention is to provide a semiconductor device in which respective layers of a protection diode and CMOS FET constituting a CMOS integrated circuit can be formed closely to each other to reduce the occupied area of the integrated circuit without causing a latch-up phenomenon.

According to this invention, a semiconductor device comprises first and second island regions of a first conductivity type formed closely to each other in the surface area of a semiconductor substrate; first- and second-channel type MOS FETs formed in the first island region; and a high impurity concentration region of the first conductivity type having an impurity concentration higher than the island regions and formed between the substrate and at least one of the first and second island regions, the high impurity concentration region being formed to surround the island regions.

In the semiconductor device with the above construction, when a noise signal is input, carriers such as holes will be introduced from at least one of a plurality of impurity layers (conductive layers) formed in the surface area of the semiconductor substrate to constitute the CMOS integrated circuit into not only the surface area but also the bottom portion. However, the carriers are absorbed into the high impurity concentration region and a large portion thereof will be inhibited from being transferred to another impurity layer, thus preventing the operation of the parasitic thyristor. Therefore, the distance between the diode and MOS FET can be significantly reduced in comparison with the conventional case, thereby reducing the occupied area of the CMOS integrated circuit.

BRIEF DESCRIPTION OF THE DRAWINGS

FIG. 1 is a sectional view of a semiconductor device according to a first embodiment of this invention;

FIGS. 2A to 2K are views showing the manufacturing process of the semiconductor device shown in FIG. 1;

FIG. 7 is a sectional view of a modification of the embodiment of FIG. 3;

FIG. 8 is a sectional view of a semiconductor device according to a third embodiment of this invention; and FIG. 9 is a sectional view of a semiconductor device according to a fourth embodiment of this invention.

DETAILED DESCRIPTION OF THE PREFERRED EMBODIMENTS

Figure 2B:
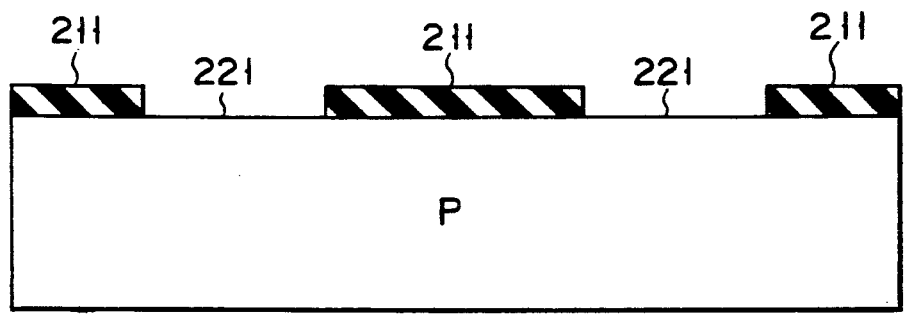

There will now be described an embodiment of this invention with reference to the accompanying drawings.

FIG. 1 shows a semiconductor device according to one embodiment of this invention. As shown in FIG. 1, first and second N-type island regions 12 and 17 are formed adjacent to each other in the surface are of P-type semiconductor substrate 14. P-channel type MOS FET 36 is formed in part of first island region 12 and N-channel type MOS FET 37 is formed in P-type well 18 which is formed in the surface area of first island region 12. Protection diode 35 is formed in part of second island region 17 with island region 17 used as a cathode and P-type layer 10 formed in the surface area of island region 17 used as an anode. Further, diode 34 is formed to have P-type well 19 formed in the surface area of second island region 17 and used as an anode and N-type layer 20 formed in the surface area of P-type well 19 and used as a cathode.

Figure 5:
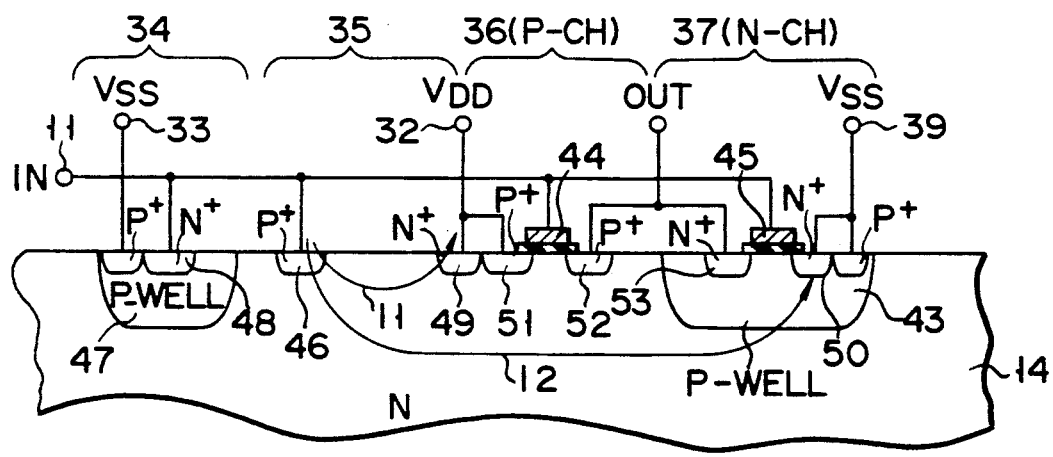
FIG. 5 is a sectional view of a semiconductor device which relates to the background technique (not the prior art) of this invention and in which a latch-up phenomenon may easily occur.
Figure 6:
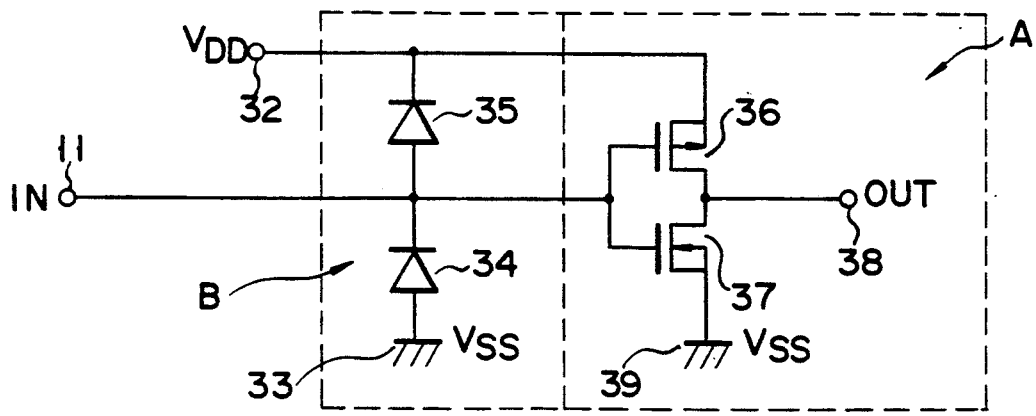
FIG. 6 is an electrical equivalent circuit of the semiconductor device of FIG. 5.

N-type high impurity concentration region 13 having a higher impurity concentration than island regions 12 and 17 is formed between P-type substrate 14 and first and second island regions 12 and 17 to surround island regions 12 and 17. The top view of region 13 has a circular or rectangular figure, for example. In other respects, the construction is the same as that of the semiconductor device shown in FIG. 5. Portions of the semiconductor device of FIG. 1 which are the same as those of the semiconductor device shown in FIG. 5 are denoted by the same reference numerals and the explanation thereof is omitted.

Figure 2C:
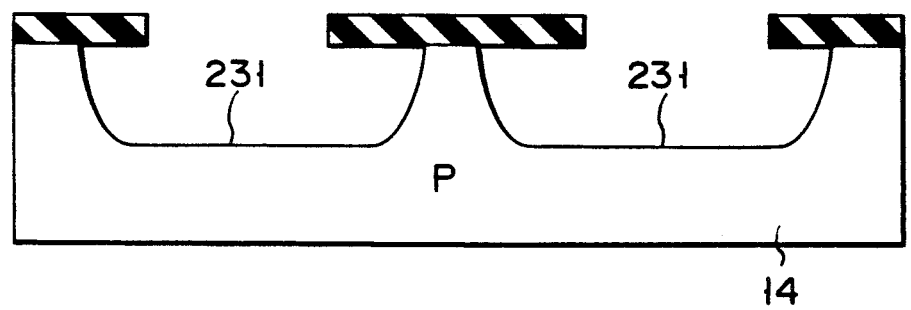
Figure 2D:
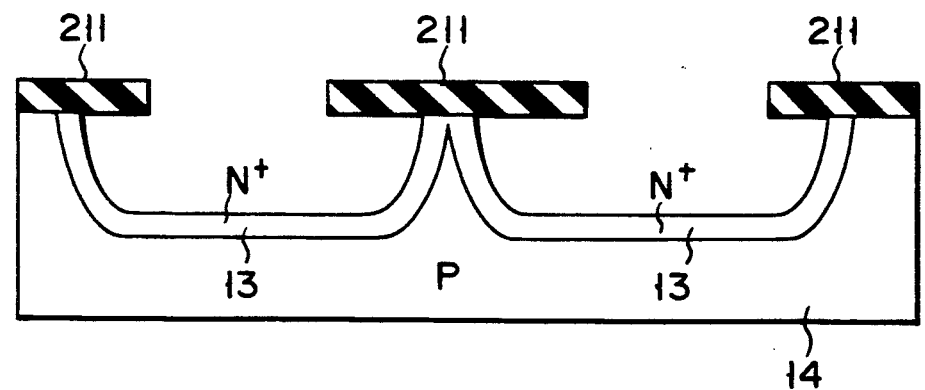

Now, one example of the method of manufacturing the semiconductor device of the above construction is explained with reference to FIGS. 2A to 2K. First, the main surface of P-type semiconductor substrate 14 with the resistivity of 5 Ω.cm is subjected to a thermal oxidation process to form oxide film 211 with a thickness of 1 μm (FIG. 2A). Then, openings are formed (patterned) in those portions of oxide film 211 which correspond to element formation regions 221 (FIG. 2B). After this, recesses 231 with a depth of approx. 10 μm are formed in element formation regions 221 of substrate 14 (See FIG. 2B) by an isotropic etching method (FIG. 2C). The distance along the substrate surface between recesses 231 is about 10 μm. Next, antimony is diffused as an impurity into the surface area of recesses 231 with the remaining portion of oxide film 211 used as a mask to form N-type high impurity concentration region 13 (FIG. 2D).

The impurity concentration of high impurity concentration region 13 is $1 \times 10^{18}/cm^3$, and the thickness thereof is 5 μm. Further, after oxide film 211 is removed, N-type epitaxial layer 251 with an impurity concentration of approx. $5 \times 10^{14}/cm^3$ is formed to a thickness of about 12 μm on the surface of substrate 14 including high impurity concentration region 13 (FIG. 2E). Then, layer 251 is polished to reach the main surface of substrate 14 for planarization, thus forming first and second island regions 12 and 17 formed of the epitaxial layer and isolated from each other (FIG. 2F). Next, a heat treatment process is effected again to form oxide film 272 of 0.1 μm used as a buffer film for the ion-implantation process. Then, in order to form a P-type well, photoresist film 271 is formed and boron is implanted with an impurity concentration of $5 \times 10^{12}/cm^3$ with photoresist film 271 used as a block (FIG. 2G).

Figure 2H:
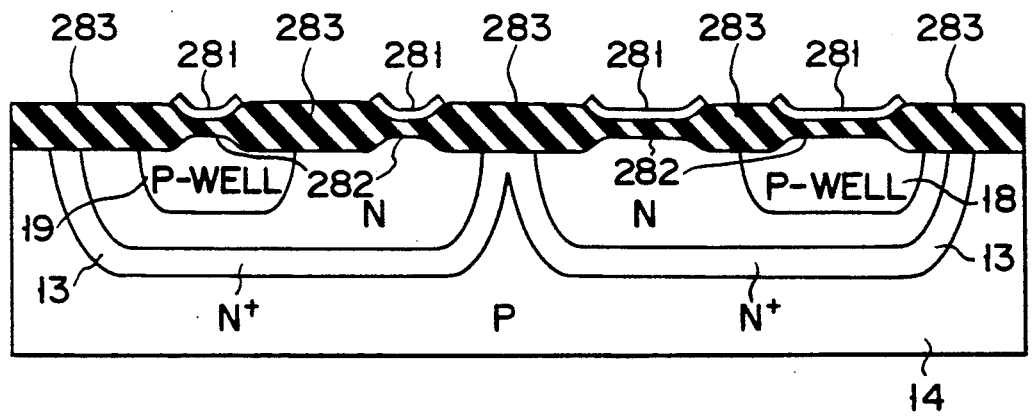
Figure 2I:
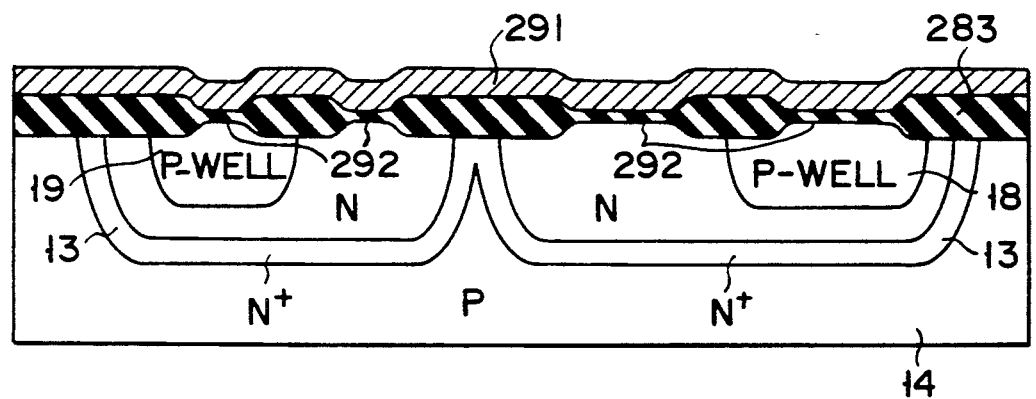

After this, a thermal diffusion process is effected at about 1200° C. for about 10 hours to cause boron ions implanted in the preceding step to diffuse to a depth of approx. 7 μm, thus forming P-type wells 18 and 19 (FIG. 2H). Silicon nitride films 281 shown in FIG. 2H are formed on the element formation regions of oxide film 272 shown in FIG. 2G. Then, selective oxidation is effected with silicon nitride film 281 used as a mask to form field oxidation film 283 with a thickness of 1 μm (FIG. 2H). After this, silicon nitride films 281 formed on the element formation regions and those portions of oxide film 282 which lie directly under silicon nitride film 281 are removed. Oxide films 292 with a thickness of 500 Å are newly formed in the oxide-film-removed areas by thermal treatment, and polysilicon layer 291 which is used as gate electrodes of MOS FETs is formed to a thickness of 5000 Å on the semiconductor structure of FIG. 2H by a chemical vapor deposition method (CVD) (FIG. 2I). Then, that portion of polysilicon layer 291 which is not used to form the gate electrodes of the MOS FETs is removed by a photoetching process, thus forming gate electrodes 44 and 45 (FIG. 2J).

Figure 2J:
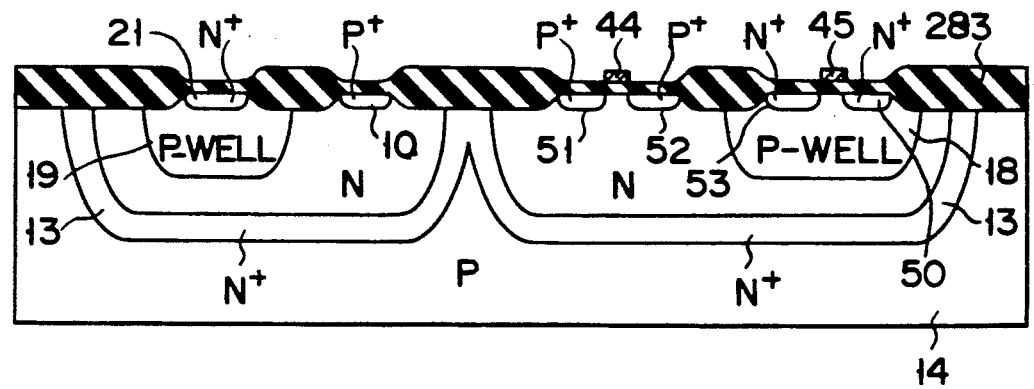
Figure 2K:
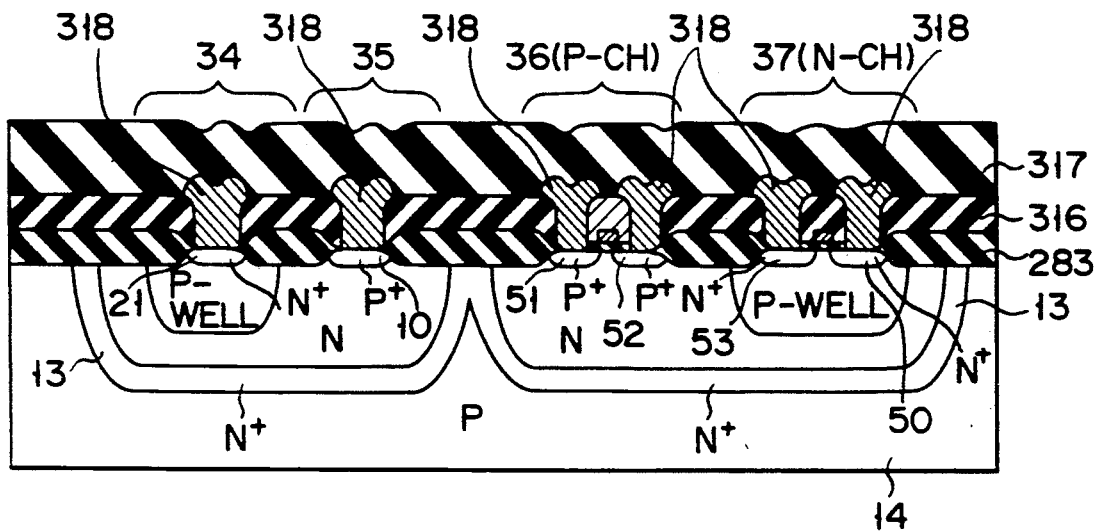

Next, a photoresist film is formed on that portion except the element formation areas in P-type wells 18 and 19 and arsenic is ion-implanted to form N-type diffusion layers 21, 50 and 53 with the photoresist film used as a mask (FIG. 2J). Then, a photoresist film is formed on the element formation areas in P-type wells 18 and 19 and boron is ion-implanted to form P-type diffusion layers 10, 51 and 52 with the photoresist film used as a mask (FIG. 2J). After this, CVD oxide film 316 is formed to a thickness of 5000 Å on the main surface of oxide film 283 by the CVD method. Contact holes are formed in the electrode formation portions for MOS FETs 36 and 37 and protection diodes 34 and 35 by a photoetching process, and aluminum is deposited to a thickness of about 1 μm and patterned to form electrodes 318. Then, phosphor glass 317 is formed to a thickness of approx. 1 μm on the main surface of the semiconductor structure to protect the surface of the CMOS integrated circuit by the CVD method (FIG. 2K).

For brevity, in the manufacturing process shown in FIGS. 2A to 2K, diffusion layers 16, 21, 22 and 23 and the like in the embodiment of FIG. 1 and the explanation thereof are omitted.

In the embodiment shown in FIG. 1, when a positive noise voltage higher than a voltage applied to power source terminal VDD 15 is applied to P-type anode layer 10 of diode 35 connected to input terminal IN 11, diode 35 is made operative (or conductive) between input terminal IN 11 and power source terminal VDD 15 to protect the gate of MOS FETs 36 and 37. At this time, carriers (holes in this embodiment) are injected from P-type diffusion layer 10 into the bottom portion of second island region 17. The injected holes are absorbed into N-type high impurity concentration region 13 formed to surround the bottom portion of island regions 12 and 17. Thus, a latch-up phenomenon can be prevented from occurring in a PNPN parasitic thyristor formed of P-type layer 10, N-type island regions 17, 12, P-type well 18 and N-type source 50.

According to this embodiment, since unwanted carriers can be absorbed into high impurity concentration region 13, the distance between the MOS FET and protection diode of the CMOS integrated circuit can be reduced to one-fifth of that in the conventional case. Therefore, even if the occupied area of the CMOS integrated circuit is significantly reduced, the latch-up phenomenon can be effectively prevented, thus making it possible to attain high integration density.

Figure 3:
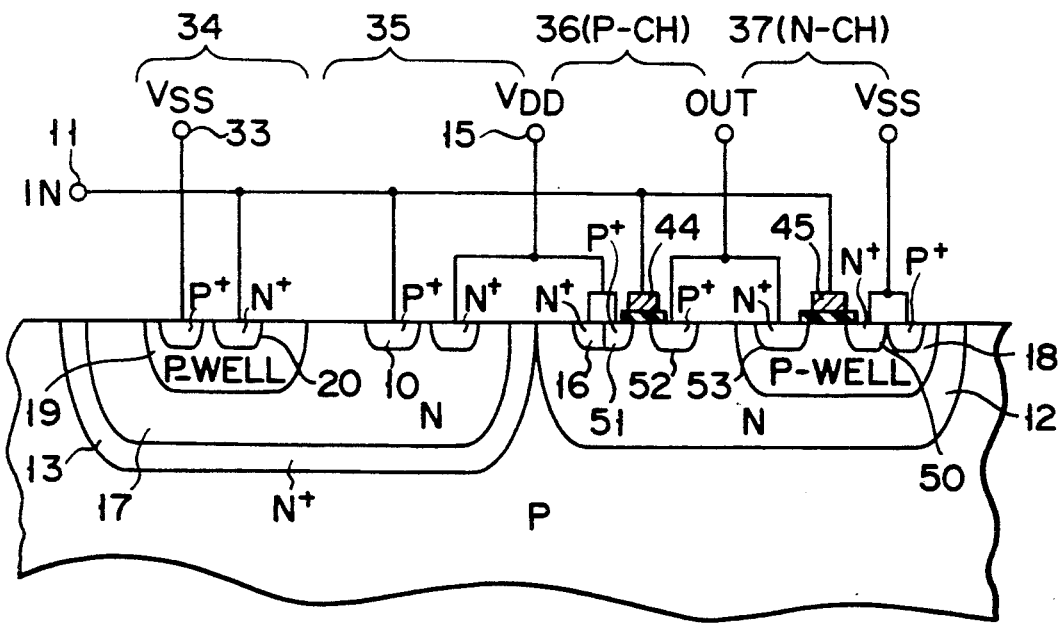
FIG. 3 is a sectional view of a semiconductor device according to a second embodiment of this invention.

FIG. 3 shows a semiconductor device according to a second embodiment of this invention. As can be clearly understood by comparing FIGS. 1 and 3, N-type high impurity concentration region 13 is formed to surround second island region 17 in which diodes 34 and 35 are formed, and a high impurity concentration region for first island region 12 in which MOS FETs 36 and 37 are formed is omitted in FIG. 3. This embodiment is similar to the first embodiment in other respects. In this case, however, a portion of high impurity concentration region 13 formed on the side wall of island region 17 is formed to at least the same thickness as that in the first embodiment in order to attain sufficient carrier absorption effect.

In the embodiment of the above construction, the same effect of high integration density and effective latch-up prevention as can be attained in the first embodiment can be obtained.

Figure 4:
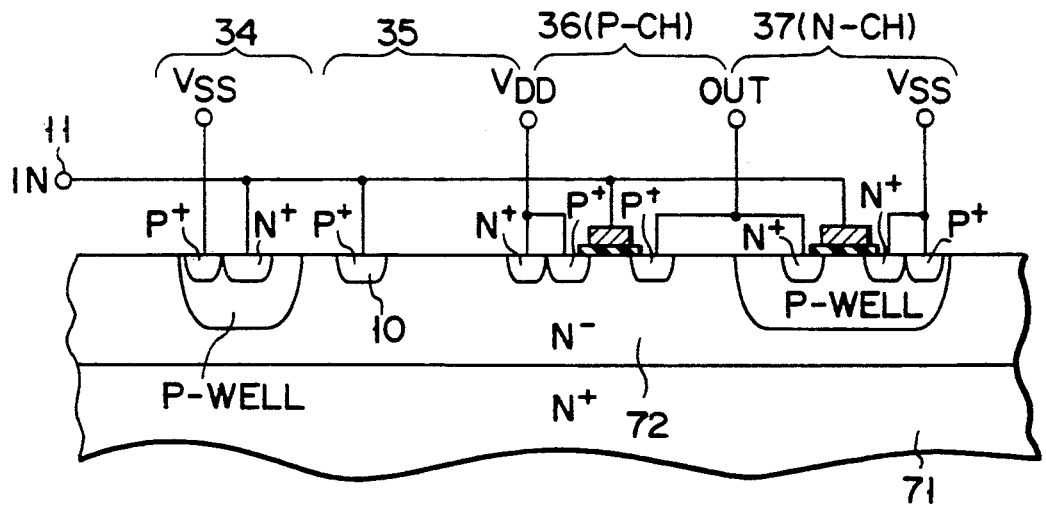
FIG. 4 is sectional view for illustrating the latch-up prevention effect attained when a high impurity concentration region is formed under the semiconductor substrate.

The invention also embodies a semiconductor structure shown in FIG. 4. That is, the semiconductor structure is so formed that carriers (or holes) injected from anode layer 10 of diode 35 into the bottom portion of the substrate by application of noise voltage would be absorbed into N-type high impurity concentration region 71 to prevent occurrence of the latch-up phenomenon. In this case, however, since high impurity concentration region 71 is formed only in the lower portion of substrate 72, all the holes moving towards the bottom of the substrate could not be absorbed. As a result, some of the holes move in substrate 72 in a transverse direction towards the MOS FET so that occurrence of the latch-up phenomenon could not be effectively prevented. In contrast, in each of the first and second embodiments of FIGS. 1 and 3, high impurity concentration region 13 is formed to cover not only the bottom portion but also the side wall of at least one of island regions 12 and 17. Therefore, unwanted injected holes can be effectively absorbed into region 13, thus reliably preventing the latch-up phenomenon from occurring.

In the above embodiments, the MOS FETs and protection diodes are respectively formed in first and second island regions 12 and 17 which are formed adjacent to each other in the surface area of the semiconductor substrate. High impurity concentration region 13 is formed to surround both of first and second island regions 12 and 17 (FIG. 1) or only second island region 17 (FIG. 3). However, the same effect can be attained in a case where high impurity concentration region 13 is formed to surround only first island region 12 in which the MOS FETs are formed as shown in FIG. 7.

FIG. 8 is a sectional view of a semiconductor device according to a third embodiment of this invention. In this embodiment, diodes 34 and 35 and transistors 36 and 37 are formed in an N-type region which is surrounded by cup-shaped N+-type high impurity concentration region 13 and is divided into two N-type regions 17 and 12 by means of N+-type isolation layer 13A. The presence of isolation layer 13A absorbs leak currents (corresponding to currents I1 and I2 in FIG. 5) between diodes 34, 35 and transistors 36, 37, thus preventing the parasitic thyristor from being erroneously turned on.

FIG. 9 is a sectional view of a semiconductor device according to a fourth embodiment of this invention. This embodiment is made by improving the structure of FIG. 4 in which the latch-up prevention could not be effectively obtained. That is, N+-type high impurity isolation layer 13B is formed in N−-type substrate 72 to reach N+-type high impurity concentration layer 71 and surround diodes 34, 35 and transistors 35, 37. Isolation layer 13B absorbs leak currents (corresponding to currents I1 and I2 in FIG. 5) between diodes 34, 35 and transistors 36, 37, thus preventing the parasitic thyristor from being erroneously turned on.

As described above, according to this invention, the MOS FETs and protection diodes are formed in first and second island regions 12 and 17 of the first conductivity type which are formed adjacent to each other in the surface area of semiconductor substrate 14. N+-type high impurity concentration region 13 of the first conductivity type which has a higher impurity concentration than island regions 12, 17 is formed between island regions 12, 17 and substrate 14 to surround at least one of island regions 12, 17. As a result, even when the distance between the protection diode and the MOS FET is significantly reduced in comparison with the conventional case, the latch-up can be effectively prevented. Thus, the occupied area of the CMOS integrated circuit can be significantly reduced, making it possible to attain high integration density.

What is claimed is:

1. A semiconductor device comprising:
   a semiconductor substrate having a surface area;
   first and second island regions of a first conductivity type each having a surface area and being adjacent to each other in the surface area of said substrate;
   a first MOS FET of a first channel type being in part of the surface area of said first island region;
   a first well of a second conductivity type having a surface area and being in another part of the surface area of said first island region;
   a second MOS FET of a second channel type in the surface area of said first well;
   a first diode being in part of the surface area of said second island region to protect a gate of said first MOS FET;
   a second well of the second conductivity type being in another part of the surface area of said second island region;
   a second diode in said second well to protect a gate of said second MOS FET; and
   a high impurity concentration region of the first conductivity type having a higher impurity concentration than said first and second island regions and being between at least one of said first and second island regions and said semiconductor substrate and surrounding said at least one of said first and second island regions;

wherein said high impurity concentration region of the first conductivity type having a higher impurity concentration than said first and second island regions is between said semiconductor substrate and said first and second island regions and surrounds both of said first and second island regions.

2. A semiconductor device according to claim 1, wherein the first diode has an anode connected to the gates of said first and second MOS FETs and a cathode connected to a first power source circuit; and the second diode has a cathode connected to the gates of said first and second MOS FETs and an anode connected to a second power source circuit.

3. A semiconductor device according to claim 1, wherein said high impurity concentration region includes a cup-shaped region individually surrounding said first and second island regions.

4. A semiconductor device according to claim 1, wherein said high impurity concentration region includes a cup-shaped region surrounding said first island region.

5. A semiconductor device according to claim 1, wherein said high impurity concentration region includes a cup-shaped region surrounding said second island region.

6. A semiconductor device according to claim 1, wherein said high impurity concentration region includes a cup-shaped region collectively or integrally surrounding said first and second island regions, and a high impurity concentration layer of the first conductivity type between said first and second island regions and reaching said cup-shaped region so that said first and second island regions are isolated from each other.

7. A semiconductor device according to claim 1, wherein said semiconductor substrate includes a high impurity concentration layer of the first conductivity type; and a low impurity concentration layer of the first conductivity type formed on said high impurity concentration layer to enclose said first and second island regions; and said high impurity concentration region being between said first and second island regions and reaching said high impurity concentration layer so that said first and second island regions are isolated from each other.

8. A semiconductor device according to claim 7, wherein said high impurity concentration region further includes a portion thereof extending to the high impurity concentration layer to surround at least one of said first and second island regions.

* * * * *